United States Patent
Sasaki et al.

(10) Patent No.: US 6,903,587 B2
(45) Date of Patent: Jun. 7, 2005

(54) CLOCK DATA RECOVERY CIRCUIT WITH IMPROVED JITTER TRANSFER CHARACTERISTICS AND JITTER TOLERANCE

(75) Inventors: Kenichi Sasaki, Kanagawa (JP); Shinichi Uchino, Kanagawa (JP); Yasushi Aoki, Kanagawa (JP)

(73) Assignee: NEC Eelctronics Corporation, Kanagawa (JP)

( * ) Notice: Subject to any disclaimer, the term of this patent is extended or adjusted under 35 U.S.C. 154(b) by 0 days.

(21) Appl. No.: 10/614,830

(22) Filed: Jul. 9, 2003

(65) Prior Publication Data

US 2004/0008066 A1 Jan. 15, 2004

(30) Foreign Application Priority Data

Jul. 9, 2002 (JP) ........................................ 2002-200351

(51) Int. Cl.[7] ................................................ H03K 5/01
(52) U.S. Cl. ........................ 327/165; 375/362; 370/509
(58) Field of Search ................................ 327/165–167, 327/144; 375/362–366; 370/503, 506, 508–514

(56) References Cited

U.S. PATENT DOCUMENTS

| | | | | |
|---|---|---|---|---|
| 5,128,939 A | * | 7/1992 | Takatori et al. ............. | 370/509 |
| 5,146,477 A | * | 9/1992 | Cantoni et al. ............. | 375/363 |
| 5,202,904 A | * | 4/1993 | Kamada ...................... | 375/372 |
| 5,271,006 A | * | 12/1993 | Ashi et al. ................... | 370/217 |
| 5,357,514 A | * | 10/1994 | Yoshida ....................... | 370/506 |
| 5,390,180 A | * | 2/1995 | Reilly .......................... | 370/476 |
| 5,831,461 A | * | 11/1998 | Dawe .......................... | 327/147 |

OTHER PUBLICATIONS

ISSCC 2002, Session 15, Gigabit Communications, Jun Cao et al., "OC–192 Receiver in Standard 0.18 μm CMOS", 2002, pp. 1–3.

* cited by examiner

*Primary Examiner*—Minh Nguyen
(74) *Attorney, Agent, or Firm*—Young & Thompson

(57) ABSTRACT

A clock extracting part has a first phase comparator circuit, a first up/down counter, a weighting circuit, a charge pump and a low-pass filter forming a voltage value determining part, and a voltage controlled oscillator circuit. A retiming clock generating part has a second up/down counter and a phase switching circuit. Furthermore, a phase adjusting part has a first counter, a second counter, a second phase comparator circuit and a third up/down counter forming a phase adjusting part. A clock data recovery circuit is formed by said clock extracting part, the retiming clock generating part, the phase adjusting part, and a first-in first-out memory part. Thereby, a clock data recovery circuit is obtained, in which jitter transfer characteristics and jitter tolerance satisfy the standards of both the SONET and SDH.

17 Claims, 10 Drawing Sheets

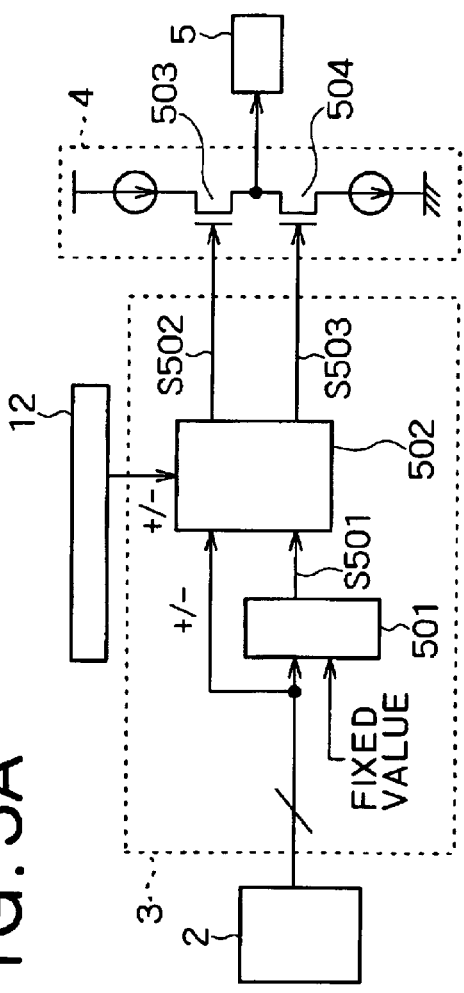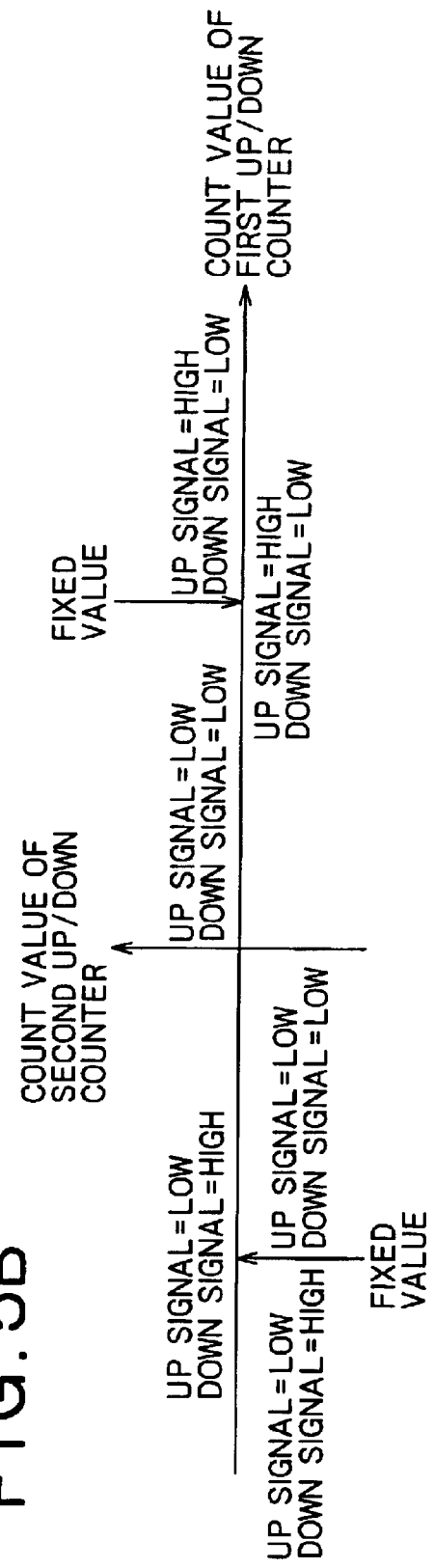
FIG. 5A
FIG. 5B

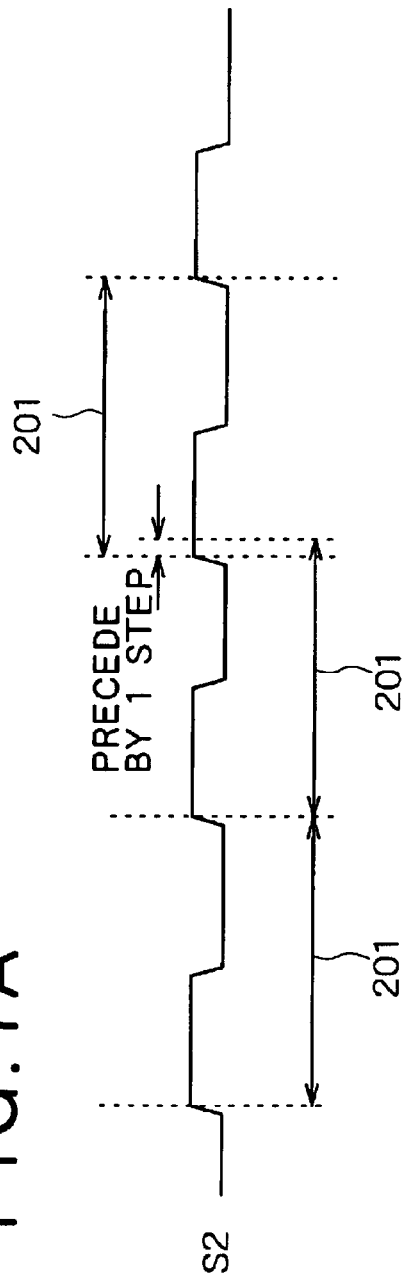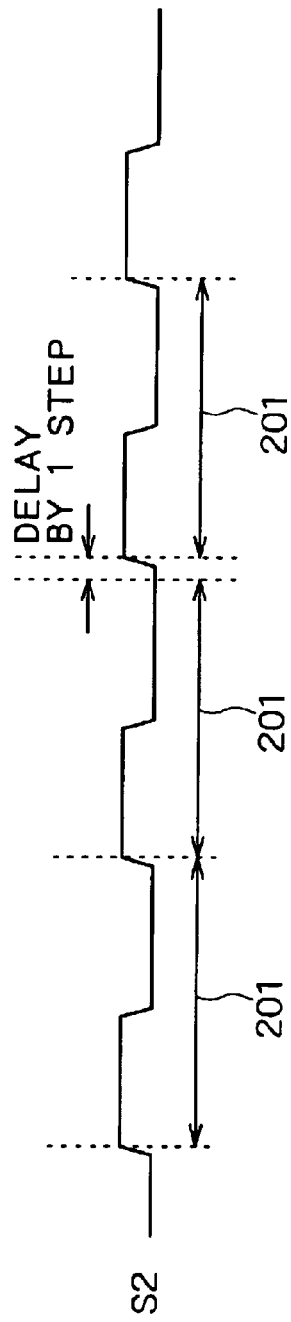

CLOCK DATA RECOVERY CIRCUIT WITH IMPROVED JITTER TRANSFER CHARACTERISTICS AND JITTER TOLERANCE

BACKGROUND OF THE INVENTION

1. Technical Field of the Invention

The present invention relates to a clock data recovery circuit, more specifically, to a clock data recovery circuit to be used in SONET (Synchronous Optical Network)/SDH (Synchronous Digital Hierarchy) standards for optical communications networks.

2. Description of the Related Art

The American Synchronous Optical Network (SONET) was standardized in the mid 1980s by the American National Standards Institute (ANSI) to efficiently house a third group of circuits (45M bits/second) in optical fiber transmission lines and to form economical digital networks. Furthermore, Synchronous Digital Hierarchy (SDH) is synchronous digital hierarchy specifications standardized as ITU-T (International Telecommunication Union-Telecommunication Standardization Sector) in 1988 based on SONET to unify digital hierarchies different among Japan, the USA, and Europe, and this SDH has realized building of ATM (Asynchronous Transfer Mode) networks on a global level.

Generally, a conventional clock data recovery circuit retimes an input signal by using a clock extracted from the input signal itself, and outputs this retimed signal and the extracted clock. In a clock data recovery circuit used in the SONET/SDH, both an extracted clock that is an output signal from the clock data recovery circuit and output data must have characteristics satisfying the SONET/SDH standards. Particularly, in a digital communications system, excessive jitter causes an unallowable BER (bit error rate), so that a clock extracted from the clock data recovery circuit and output data must have jitter transfer characteristics and jitter tolerance, both of which satisfy the SONET/SDH standards.

FIG. 1 is a block diagram showing a general conventional clock data recovery circuit (Digest of Technical Papers, pp.251, FIG. 15.2.2, 2002 IEEE, International Solid-State Circuits Conference). In the conventional clock data recovery circuit, serial data S401 and a clock S402 outputted from a voltage controlled oscillator (VCO) 407 are inputted into a phase detector (PD) 401 and a frequency detector (FD) 402, respectively, to obtain information on the phase difference and frequency difference between these serial data S401 and clock S402. Obtained phase difference information S403 and frequency difference information S404 are smoothed by a PD filter 403 or an FD filter 404, respectively, to obtain smoothed phase difference information S405 and frequency difference information S406. These smoothed information S405 and S406 are inputted into a weighting circuit 405, weighted, and switched to obtain an output S407. This output S407 from the weighting circuit 405 is inputted into a high-frequency reject filter (low-pass filter: LPF) 406, and an output S408 from this LPF 406 is inputted as input voltage information into the VCO 407. In response to this input voltage, the oscillation frequency of the VCO 407 is controlled and a clock S402 is outputted.

The phase detector 401, the frequency detector 402, the PD filter 403, the FD filter 404, the weighting circuit 405, the LPF 406, and the VCO 407 are connected so as to form a phase-locked loop (PLL). Therefore, the clock S402 outputted from the VCO 407 becomes a clock extracted from the serial data S401. A flip-flop 408 retimes the serial data S401 by the clock S402 outputted from the VCO 407. Therefore, the clock S402 that is extracted for retiming and outputted from the VCO 407 and the retimed serial data S409 outputted from the flip-flop 408 become an output of the clock data recovery circuit.

However, in such a conventional clock data recovery circuit, since this serial data is retimed by the clock extracted from the serial data itself, the phase of the extracted clock and the phase of the clock for retiming cannot be controlled separately. Therefore, in a case where the inputted serial data contains jitter of high-frequency components, standards of both jitter transfer characteristics and jitter tolerance cannot be satisfied.

For example, in the conventional clock data recovery circuit shown in FIG. 1, when the circuit is controlled so as to suppress jitter of the extracted clock S402, jitter transfer characteristics are satisfied. However, if the inputted serial data S401 contains jitter, the flip-flop 408 retimes the data containing jitter by a clock in which jitter has been suppressed, and this causes a data error. Therefore, jitter tolerance is not satisfied. On the other hand, in a case where the circuit is controlled so as not to suppress jitter of the extracted clock S402, even if the inputted serial data S401 contains jitter, the flip-flop 408 retimes the data containing jitter by a clock containing the same jitter, and this reduces the frequency of data errors. Accordingly, jitter tolerance is improved. However, in this case, the extracted clock S402 contains the same jitter as in the inputted serial data S401, so that jitter transfer characteristics cannot be satisfied.

SUMMARY OF THE INVENTION

An object of the invention is to provide a clock data recovery circuit which has jitter transfer characteristics and jitter tolerance, both of which satisfy the SONET/SDH standards by separating a circuit part for extracting a clock from an input signal from a circuit part for generating a retiming clock, and by controlling the phase of the extracted clock and the phase of the retiming clock separately from each other.

A clock data recovery circuit relating to the invention comprises a clock extracting part for extracting an input clock from an input signal, a retiming clock generating part for generating a retiming clock for retiming the input signal, a first-in first-out memory part for temporarily storing an input signal that has been retimed, and a phase adjusting part which avoids overlapping between an address value of the writing side and an address value of the reading-out side by controlling a writing timing at the first-in first-out memory part by the retiming clock and controlling a reading-out timing by the input clock.

In this invention, a retiming clock for retiming an input signal can be generated independently from an input clock extracted by a clock extracting part. Therefore, even when the phase of the input clock extracted by the clock extracting part is adjusted so as to improve jitter transfer characteristics which results in lowering in jitter tolerance, a retiming clock satisfying jitter tolerance standards can be generated by adjusting separately the phase of the retiming clock at the retiming clock generating part. Furthermore, the input clock, retiming clock, and input signal are inputted into the first-in first-out memory, and the input signal is retimed by the retiming clock satisfying the jitter tolerance standards, whereby data that has been transferred to the extracted input clock satisfying the jitter transfer characteristics standards can be outputted. Therefore, standards of both jitter tolerance and jitter transfer characteristics can be satisfied. Furthermore, since the clock data recovery circuit has a phase adjusting part, an address value of the writing side of the first-in first-out memory part is prevented from coinciding with an address value of the reading-out side.

The clock extracting part can comprise a first phase comparator circuit which outputs an up signal or a down signal by comparing the phase of the retiming clock and the phase of the input signal, and outputs the input signal after retiming it by the retiming clock, a first up/down counter which adds or subtracts 1 to or from its count value in accordance with the up signal or down signal outputted from the first phase comparator circuit, a weighting circuit which outputs an up or down signal that has been weighted in accordance with the count value inputted from the first up/down counter, a voltage value determining part which determines and outputs a voltage value in accordance with the up signal or down signal inputted from the weighting circuit, and a voltage controlled oscillator circuit which determines an oscillation frequency in accordance with the inputted voltage value from the voltage value determining part and outputs the input clock.

The retiming clock generating part can comprise a second up/down counter which outputs a count value as a result of addition or subtraction of 1 to or from the count value in response to an up signal or a down signal inputted from the first phase comparator circuit, and a phase switching circuit which outputs the retiming clock by adjusting the phase of the input clock inputted from the clock extracting part in response to the count value inputted from the second up/down counter.

The weighting circuit can comprise a magnitude comparator which compares an up signal or down signal inputted from the first up/down counter and a fixed value, and a logical circuit which determines a signal to be outputted to the voltage value determining part based on the magnitude comparison data from the magnitude comparator, the count value from the first up/down counter, and the count value inputted from the third up/down counter.

The phase adjusting part can comprise a first counter which outputs a count value counted at the timings of the retiming clock inputted from the retiming clock generating part and the highest-order bit of this count value, a second counter which outputs a count value counted at the timings of the input clock inputted from the clock extracting part and the highest-order bit of this count value, a second phase comparator circuit which compares the phase of the highest-order bit of the count value inputted from the first counter and the phase of the highest-order bit of the count value inputted from the second counter and outputs an up signal or a down signal, and a third up/down counter which adds or subtracts 1 to or from the count value in accordance with the up signal or down signal inputted from the second phase comparator circuit and outputs the obtained count value.

The first phase comparator circuit can comprise a first flip-flop which retimes the input signal by the retiming clock and outputs it, a second flip-flop which outputs a high signal or a low signal by comparing the phase of the input signal and the phase of the retiming clock, and a third flip-flop which outputs an up signal or a down signal in response to the high signal or low signal inputted from the second flip-flop.

This first flip-flop retimes the input signal by the input clock and outputs it, whereby the first phase comparator circuit can output a signal which has small possibility of containing a data error and input it into the first-in first-out memory part. Furthermore, in response to a signal generated by the second flip-flop, the third flip-flop can generate and output an up signal or a down signal that is necessary to determine the phases of clocks to be outputted from the retiming clock generating part and the clock extracting part.

BRIEF DESCRIPTION OF THE DRAWINGS

FIG. 5 are a block diagram showing the internal structure of a weighting circuit as one of the components of the clock extracting part of the clock data recovery circuit relating to the first embodiment, and a diagram showing operations of input/output signals into and from this weighting circuit.

FIG. 7 are waveform charts showing operation of the phase switching circuit as one of the components of the retiming clock generating part of the clock data recovery circuit relating to the first embodiment of the invention.

THE PREFERRED EMBODIMENTS OF THE INVENTION

Figure 1:
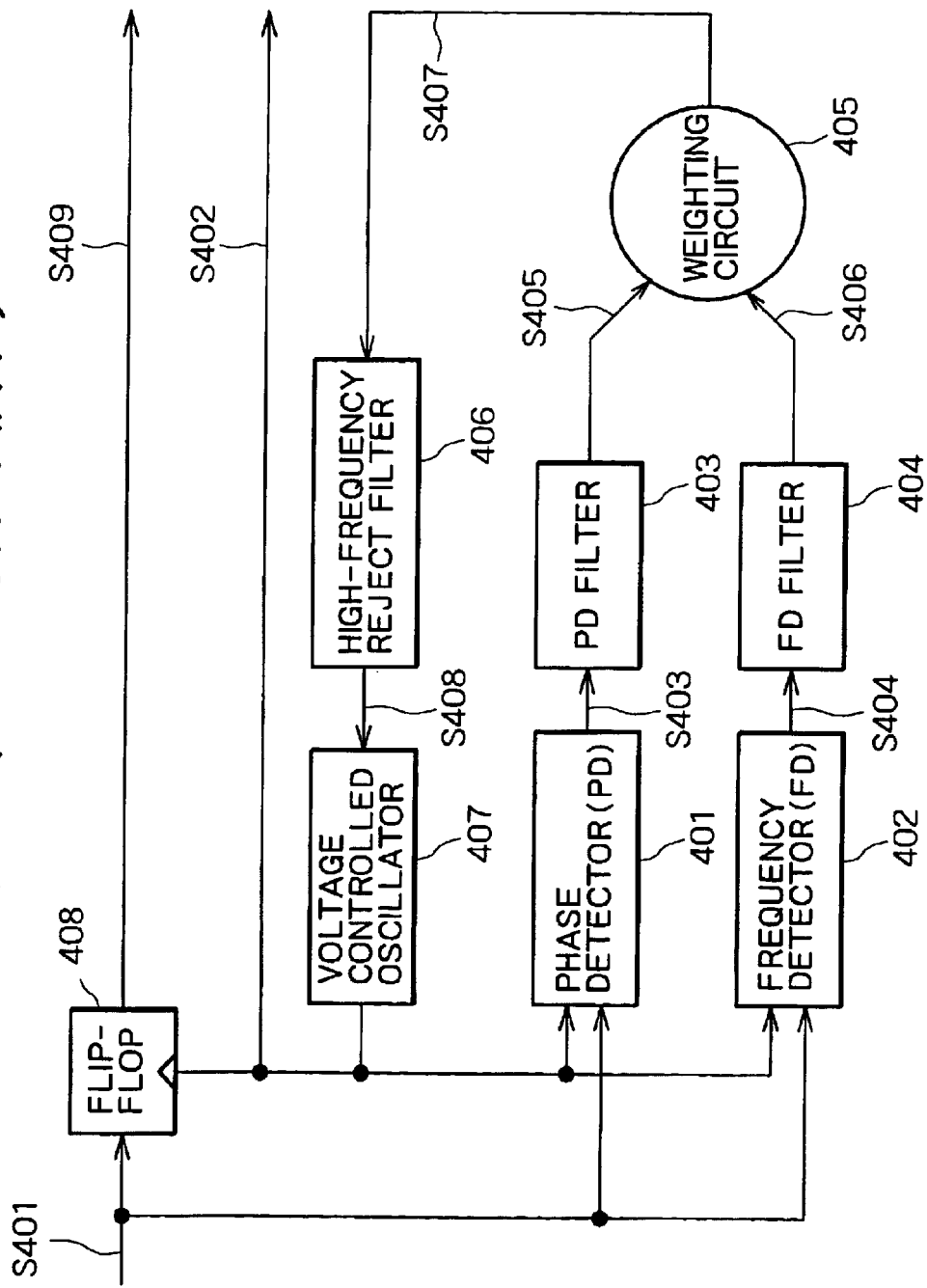
FIG. 1 is a block diagram showing the construction of the conventional clock data recovery circuit.
Figure 2:
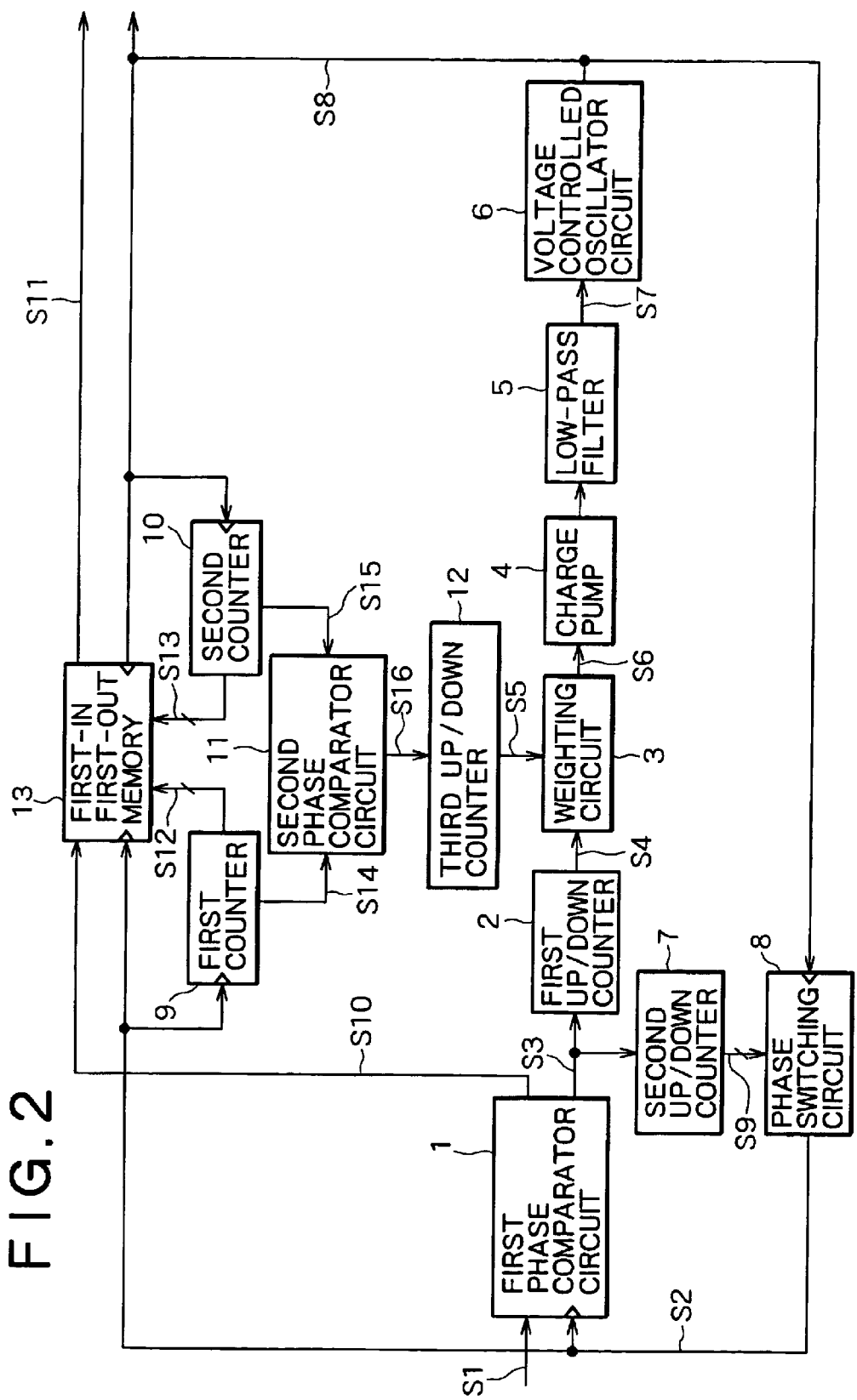
FIG. 2 is a block diagram showing the construction of a clock data recovery circuit relating to a first embodiment of the invention.

Hereinafter, clock data recovery circuits relating to embodiments of the present invention are described in detail with reference to the accompanying drawings. FIG. 2 is a block diagram showing the construction of the clock data recovery circuit relating to the first embodiment of the invention.

In this embodiment, a clock extracting part comprises a first phase comparator circuit 1, a first up/down counter 2, a weighting circuit 3, a charge pump 4 and a low-pass filter 5 that form a voltage determining part, and a voltage controlled oscillator circuit 6.

Furthermore, a retiming clock generating part comprises a second up/down counter 7 and a phase switching circuit 8.

Furthermore, a phase adjusting part comprises a first counter 9, a second counter 10, a second phase comparator circuit 11, and a third up/down counter 12.

The abovementioned clock extracting part and retiming clock generating part, a phase adjusting part, and a first-in first-out memory part 13 are connected as shown in the block diagram of FIG. 2, whereby the entirety of the clock data recovery circuit relating to this embodiment is constructed. Furthermore, in this embodiment, serial data S1 to be inputted first is a digital signal converted into a pulse signal by means of the NRZ (Non-Return-to-Zero).

Serial data S1 to be inputted into this clock data recovery circuit is inputted into the first phase comparator circuit first. The first phase comparator circuit 1 is inputted with this serial data S1 and a retiming clock S2 outputted from the retiming clock generating part, and compares the phases of these, and outputs an up signal or down signal S3 to the first up/down counter 2 and the second up/down counter 7. This first phase comparator circuit 1 outputs serial data S1 that has been retimed by the retiming clock S2 inputted from the retiming clock generating circuit to the first-in first-out memory part 13.

Figure 3:
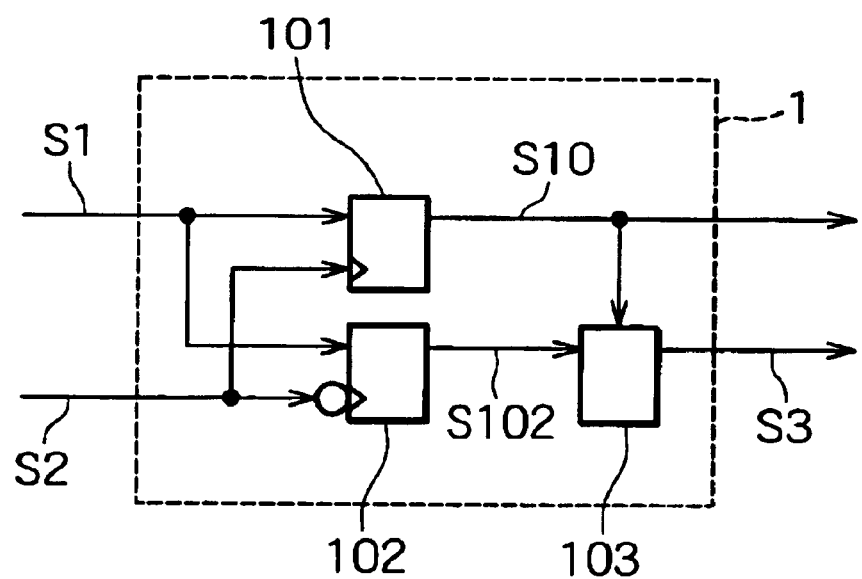
FIG. 3 is a block diagram showing the internal structure of a first phase comparator circuit as one of the components of the clock extracting part of the clock data recovery circuit relating to the first embodiment.

FIG. 3 is a block diagram showing the internal structure of the first phase comparator circuit 1. The serial data S1 and the retiming clock S2 to be inputted into the first phase comparator circuit 1 are inputted into the first flip-flop 101 and the second flip-flop 102, respectively. However, before the retiming clock S2 is inputted into the second flip-flop 102, the phase of this clock S2 is inverted. An output S10 of the first flip-flop 101 is inputted into a clock terminal of the third flip-flop 103, and an output S102 of the second flip-flop 102 is inputted into a data terminal of the third flip-flop 103. The serial data S10 to be outputted from the first flip-flop 101 employs the value of the initially inputted serial data S1, which has been taken-in at a rise timing of the retiming clock S2. Furthermore, the signal S102 to be outputted from the second flip-flop 102 employs a value of the serial data S1, which has been taken-in at a fall timing of the retiming clock S2. Furthermore, the clock S3 to be outputted from the third flip-flop 103 employs a value of the output S102 of the second flip-flop 102, which has been taken-in at a rise timing of the output S10. Therefore, the serial data S10 to be outputted from the first flip-flop 101 becomes a serial data that has been retimed by the retiming clock S2. Furthermore, the signal S3 to be outputted from the third flip-flop 103 is an up signal or a down signal.

Figure 4A:
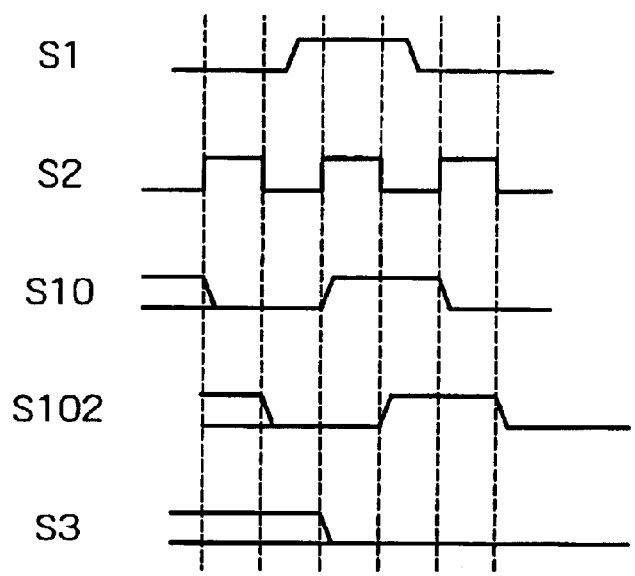
FIG. 4 are timing charts showing operation of the phase comparator circuit shown in FIG. 3.
Figure 4B:
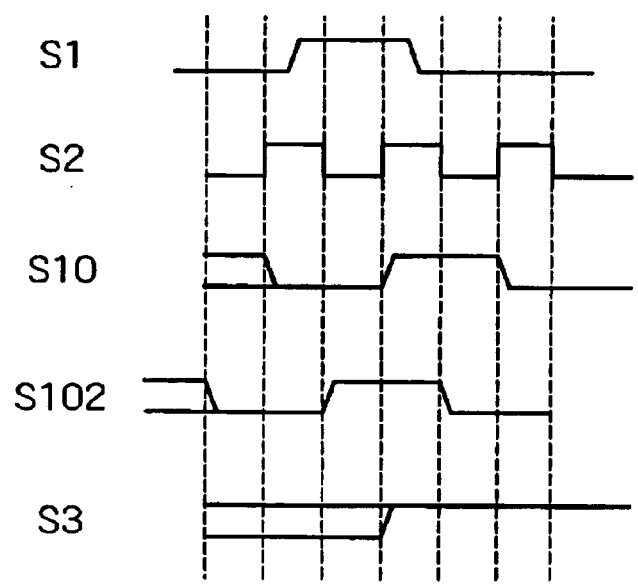

FIGS. 4A and 4B are timing charts showing operation of the first phase comparator circuit 1 comprising these three flip-flops, wherein waveforms of input signals and output signals of the respective flip-flops are shown. As shown in FIG. 4A, in a case where a rise of the retiming clock S2 is before a change point of the serial data S1 and before the center between the change points, the signal S102 outputted from the second flip-flop 102 goes low when the serial data S10 outputted from the first flip-flop 101 rises, so that the signal S3 to be outputted from the third flip-flop becomes a down signal. On the other hand, as shown in FIG. 4B, in a case where the rise of the retiming clock S2 is after the change point of the serial data S1 and after the center between the change points, the signal S102 outputted from the second flip-flop 102 goes high when the serial data S10 outputted from the first flip-flop 101 rises, so that the signal S3 to be outputted from the third flip-flop becomes an up signal. This up signal or down signal S3 is outputted to the first up/down counter 2 and the second up/down counter 7.

The first up/down counter 2 is inputted with the up signal or down signal S3 outputted from the first phase comparator circuit 1. This first up/down counter 2 outputs a count value S4 that has been added by 1 when the up signal S3 is inputted, and outputs a count value S4 that has been subtracted by 1 when the down signal S3 is inputted. This count value S4 is inputted into the weighting circuit 3 and applied with weighting and switching, etc., and then outputted as a changed up signal or down signal S5 to the charge pump 4. This charge pump 4 and a low-pass filter 5 which smoothes high-frequency components in data outputted from the charge pump 4, form a voltage value determining part.

FIG. 5A shows the internal structures of the weighting circuit 3 and the charge pump 4. The weighting circuit 3 comprises a magnitude comparator 501 which compares the count value S4 inputted from the first up/down counter 2 and a fixed value and outputs magnitude comparison data S501, and a logical circuit 502 which determines a signal to be outputted to the voltage value determining part based on the magnitude comparison data S501 outputted from the magnitude comparator 501, the count value S4 inputted from the first up/down counter 2, and the count value S5 inputted from the third up/down counter 12. FIG. 5B shows combinations of these two count values and the fixed value and the output of the weighting circuit 3 which is determined by these input values. The magnitude comparator 501 compares the count value S4 to be inputted from the first up/down counter 2 and the fixed value and inputs obtained magnitude information into the logical circuit 502. This logical circuit 502 outputs the up signal S502 and down signal S503 to the charge pump 4 based on the positive/negative information on the count values S4 and S5 inputted from the first up/down counter 2 and the third up/down counter 12 and the magnitude comparison information S501 inputted from the magnitude comparator 501.

For example, as shown in FIG. 5B, when the up signal S502 from the logical circuit 502 is high and the down signal S503 is low, a transistor 503 forming the charge pump 4 is turned on and a transistor 504 is turned off. At this point, the output voltage of the charge pump 4 goes high. When the up signal S502 from the logical circuit 502 is low and the down signal S503 is high, the transistor 503 forming the charge pump 4 is turned off, and a transistor 504 is turned on. At this point, the output voltage of the charge pump 4 goes low. When both the up signal S502 and down signal S503 from the logical circuit 502 are low, both the transistor 503 and the transistor 504 forming the charge pump 4 are turned off, and the impedance of the output voltage of the charge pump 4 becomes high.

The retiming clock generating part relating to this embodiment comprises the second up/down counter 7 and a phase switching circuit 8. The second up/down counter 7 is inputted with the up signal or down signal S3 outputted from the first phase comparator circuit 1. The second up/down counter 7 takes-in this up signal or down signal S3 from the first phase comparator circuit 1 for every fixed cycle, and outputs a count value added by 1 when the taken-in signal S3 is an up signal and outputs a count value S9 subtracted by 1 when the taken-in signal S3 is a down signal to the phase switching circuit 8. The phase switching circuit 8, which has been inputted with the count value S9 from the second up/down counter 7 and the extracted input clock S8 outputted by the voltage controlled oscillator circuit 6, outputs a retiming clock S2 having a phase deviating from the phase of the extracted input clock S8 based on this count value S9 outputted from the second up/down counter 7.

Figure 6:
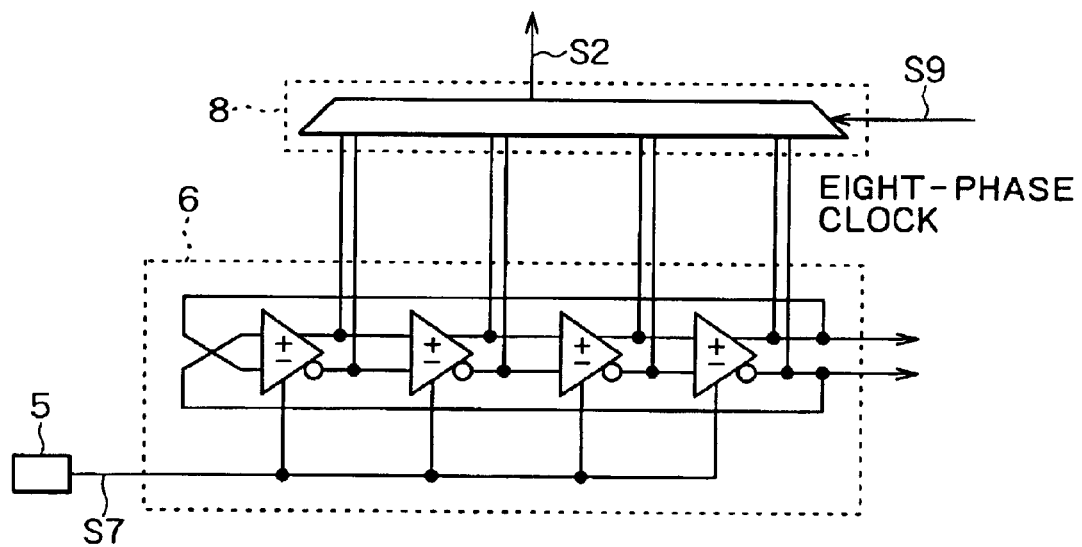
FIG. 6 is a diagram showing operation of a phase switching circuit as one of the components of a retiming clock generating part of the clock data recovery circuit relating to the first embodiment of the invention.

FIG. 6 shows the internal structures of the voltage controlled oscillator circuit 6 and the phase switching circuit 8. The voltage controlled oscillator circuit 6 can be formed of a ring oscillator obtained by annularly connecting four delay devices in series as shown in FIG. 6. The oscillation frequency of the voltage controlled oscillator circuit 6 is determined by signal delay times of the respective delay devices, and the signal delay times of the respective delay devices are determined by a control voltage S7 inputted from the low-pass filter 5. When the control voltage S7 is fixed, by selecting any one output of the output terminals of the respective delay devices, an extracted input clock S8 having a desired phase can be obtained. This signal of the output terminal of each delay device is outputted by the phase switching circuit 8. Furthermore, the phase switching circuit 8 switches the clock oscillation phase in the voltage controlled oscillator circuit 6 by a selector based on the count value S9 inputted from the second up/down counter 7.

FIGS. 7A and 7B show waveforms of the retiming clock S2 outputted from the phase switching circuit 8. As shown in FIG. 7A, the phase switching circuit 8 outputs the phase of the retiming clock S2 after switching the phase of the retiming clock S2 into a phase advanced by the number of seconds (1 step) corresponding to a value resulting from dividing the cycle of this retiming clock S2 by an optional natural number when the count value S9 inputted from the second up/down counter 7 is a count value added by 1. To the contrary, when the count value S9 inputted from the second up/down counter 7 is a count value subtracted by 1, as shown in FIG. 7B, the phase switching circuit 8 outputs the retiming clock S2 after switching the phase of the retiming clock S2 into a phase delayed by 1 step. The cycle 201 of these clocks is constant before and after the clock phase switching operation. Furthermore, the cycle 201 of these clocks coincides with the clock cycle of the count value S9 inputted from the second up/down counter 7. Therefore, the phase of the retiming clock S2 to be outputted from the phase switching circuit 8 can quickly follows the phase of the serial data S1 that is the initial input signal, so that even when the serial data S1 contains jitter of high frequency components, a retiming clock S2 that follows the jitter of high frequency components and contains jitter is outputted.

This retiming clock S2 outputted from the phase switching circuit 8 is inputted into the first phase comparator circuit 1 and used for retiming the serial data S1. As shown in FIG. 3, the first phase comparator circuit 1 outputs serial data S10 obtained by retiming the serial data S1 by the retiming clock S2 in the flip-flop 101 as a component of the first phase comparator circuit. The retiming clock S2 outputted from the phase switching circuit 8 quickly follow the phase of the serial data S1, so that there is little possibility that a data error occurs during retiming even when the serial data S1 contains jitter of high frequency components, whereby the jitter tolerance standards can be reliably satisfied.

The phase adjusting part relating to this embodiment comprises a first counter 9, a second counter 10, and a second phase comparator circuit 11 and a third up/down counter 12 that composes the phase adjusting part. The first counter 9 outputs a count value S12 counted at the timings of the retiming clock S2 that is inputted from the phase switching circuit 8 and highest-order bit information S14 of this count value S12 to the first-in first-out memory part 13 and the second phase comparator circuit 11, respectively. Furthermore, the second counter 10 outputs a count value S13 counted at the timings of the extracted input clock S8 inputted by the voltage controlled oscillator circuit 6 and highest-order bit information S15 of this count value S13 to the first-in first-out memory part 13 and the second phase comparator circuit 11, respectively. The first-in first-out memory part 13, which is inputted with the count value S12 outputted from the first counter 9 and the count value S13 outputted from the second counter 10, is inputted with the serial data S10 outputted from the first phase comparator circuit 1, the retiming clock S2 outputted from the phase switching circuit 8, and the extracted input clock S8 outputted by the voltage control oscillation circuit 6, transfers the serial data S10 from the retiming clock S2 containing jitter components outputted from the phase switching circuit 8 to the extracted input clock S8 outputted from the voltage controlled oscillator circuit 6, in which jitter components have been suppressed, and outputs the transferred data as serial data S11. Therefore, the serial data S11 outputted from the first-in first-out memory part 13, that is, the output signal of the clock data recovery circuit is outputted as serial data S11 in which jitter has been suppressed. Accordingly, standards of the jitter transfer characteristics can be reliably satisfied.

Furthermore, in this embodiment, the first up/down counter 2 is inputted with the up signal or down signal S3 outputted from the first phase comparator circuit 1. This first up/down counter 2 outputs a count value S4 added by 1 when the up signal S3 is inputted, and outputs a count value S4 subtracted by 1 when the down signal S3 is inputted. This count value S4 is inputted into the weighting circuit 3 and applied with weighting and switching, etc., and then outputted to the charge pump 4 as a changed up signal or down signal S5. This charge pump 4 and a low-pass filter 5 which smoothes high-frequency components in the data outputted from the charge pump 4, form a voltage value determining part. Therefore, this voltage value determining part increases a control voltage S7 to be outputted to the voltage controlled oscillator circuit 6 when the up signal S5 is inputted from the weighting circuit 3, and lowers the control voltage S7 to be outputted to the voltage controlled oscillator circuit 6 when the down signal S5 is inputted from the weighting circuit 3. Therefore, the frequency of the clock S8 to be outputted from the voltage controlled oscillator circuit 6, that is, the frequency of the input clock S8 extracted and outputted by the clock extracting part increases when the control voltage S7 to be inputted into the voltage control oscillator circuit 6 rises, and lowers when the control voltage S7 falls. Therefore, the frequency of the extracted input clock S8 to be outputted by the voltage controlled oscillator circuit 6 is controlled in accordance with the up signal or down signal S5 that has been applied with weighting and switching, etc., at the weighting circuit 3. Accordingly, by operating the weighting circuit 3 so that the phase of the extracted input clock S8 follows comparatively slowly the serial data S1, even when the serial data S1 contains jitter of high frequency components, an extracted input clock S8 in which jitter of high frequency components is suppressed can be outputted.

Figure 8:
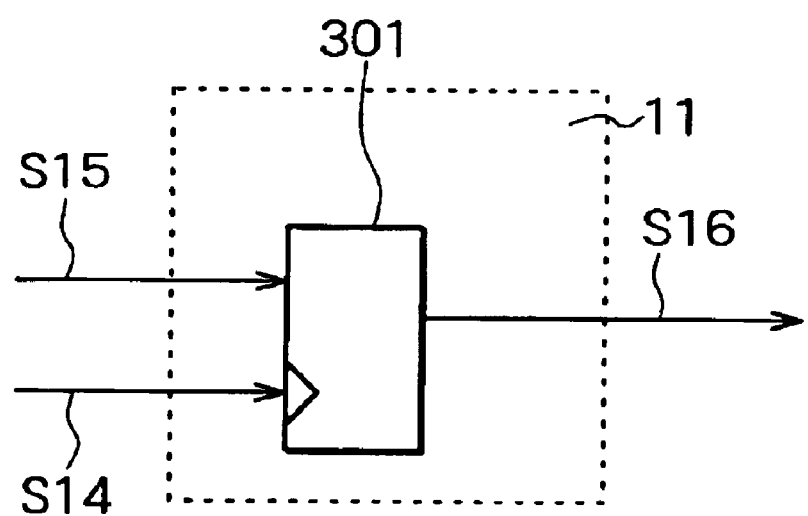
FIG. 8 is a block diagram showing the internal structure of a second phase comparator circuit as one of the components of the phase adjusting part of the clock data recovery circuit relating to the first embodiment of the invention.

In the first-in first-out memory part 13 relating to this embodiment, an address value of the writing side and an address value of the reading-out side are prevented from coinciding with each other by an effect of the phase adjusting part. FIG. 8 is a block diagram showing the internal structure of the second phase comparator circuit 11. The second phase comparator circuit 11 can be composed of only one flip-flop 301. As shown in FIG. 8, the flip-flop 301 is inputted with the highest-order bit information S14 of the count value S12 outputted from the first counter 9 by the clock input terminal thereof, and receives the highest-order bit information S15 of the count value S13 outputted from the second counter 10 by the data input terminal thereof. Then, the flip-flop 301 outputs a value which has taken-in the highest-order bit information S15 inputted into this data terminal to the third up/down counter 12 as an up signal or down signal S16 outputted by the second phase comparator circuit 11.

The count value S12 outputted from the first counter 9 and the count value S13 outputted from the second counter 10 corresponds to an address value of the writing side of the first-in first-out memory part 13 and an address value of the reading-out side. FIG. 7 are timing charts showing operations of the first counter 9 and the second counter 10 in a case where the depth of the address space of this first-in first-out memory part is 4. The count value S12 outputted from the first counter 9 and the count value S13 outputted from the second counter 10 take integer values in a range of 0 to 3. For example, when the count value is 2 or 3, the highest-order bit of this count value is high. Therefore, the phase of the highest-order bit information S14 of the count value S12 outputted from the first counter 9 and the phase of the highest-order bit information S15 of the count value S13 outputted from the second counter 10 are deviated from each other by 180°, the distance between the address value of the writing side and the address value of the reading-out side of the first-in first-out memory part 13 can be set to half the depth of the address space of this first-in first-out memory part, whereby the address value of the writing side and the address value of the reading-out side are prevented from coinciding with each other.

Figure 9A:
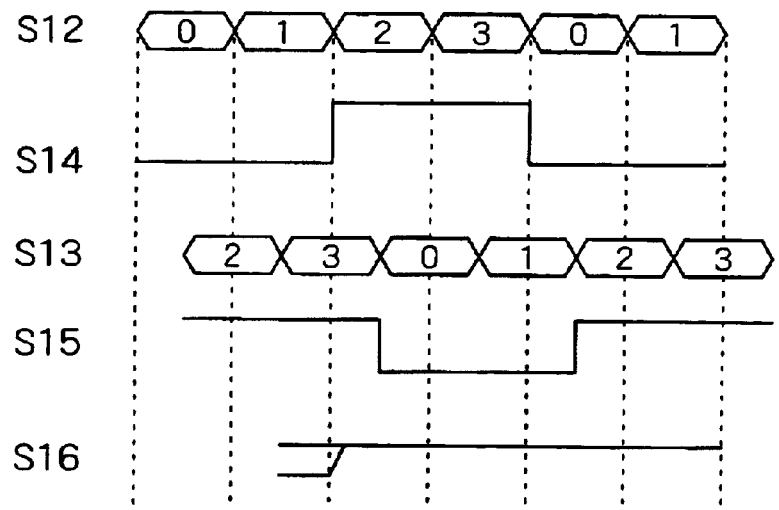
FIG. 9 are timing charts showing operations of a first counter and a second counter as components of the phase adjusting part of the clock data recovery circuit relating to the first embodiment.
Figure 9B:
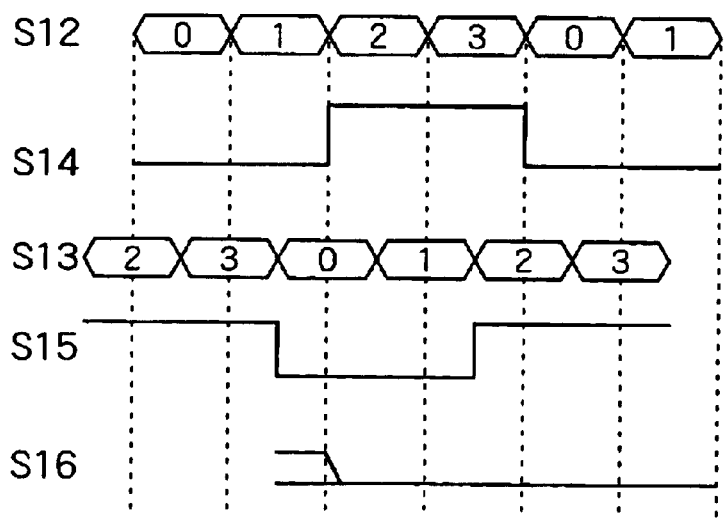

As shown in FIG. 9A, the signal S16 outputted from the flip-flop 301 goes high in a case where the highest-order bit information S15 of the count value S13 counted by the second counter 10 is high when the highest-order bit information S14 of the count value S12 counted by the first counter 9 rises, and the second phase comparator circuit 11 composed of this flip-flop 301 outputs an up signal S16 to the third up/down counter 12. Furthermore, as shown in FIG. 9B, when the highest-order bit information S14 of the count value S12 counted by the first counter 9 rises, the signal S16 outputted from the flip-flop 301 goes low in a case where the highest-order bit information S15 of the count value S13 counted by the second counter 10 is low, and the second phase comparator circuit 11 composed of this flip-flop 301 outputs a down signal S16 to the third up/down counter 12.

This third up/down counter 12 outputs a count value S5 added by 1 when being inputted with the up signal S16 from the second phase comparator circuit 11, and outputs a count value S5 subtracted by 1 when being inputted with the down signal S16 to the weighting circuit 3. The weighting circuit 3 which is inputted with this count value S5 outputted from the third up/down counter 12 outputs an up signal or a down signal S6 that has been applied with weighting and switching, etc., to the charge pump 4. This charge pump 4 is a component of the voltage value determining part of the clock extracting part as well as the low-pass filter 5. Therefore, by operation of the phase adjusting part as mentioned above, the clock extracting part can control the oscillation frequency of the extracted input clock S8 to be outputted from the voltage controlled oscillator circuit 6. Therefore, by controlling the oscillation frequency of the extracted input clock S8, the phase of the count value S13 outputted from the second counter 10 into which this clock S8 is inputted can be controlled. Accordingly, it becomes possible to control the address value of the reading-out side of the first-in first-out memory part 13 which is adjusted by this count value S13, whereby the address value of the writing side of the first-in first-out memory part 13 can be prevented from coinciding with the address value of the reading-out side.

In the first embodiment relating to the invention, first, the phases of the serial data S1 and the retiming clock S2, inputted into the first phase comparator circuit 1 are compared with each other. Next, the first phase comparator circuit 1 outputs an up signal or down signal S3 based on a result of this phase comparison. This up signal or down signal S3 is inputted into the first up/down counter 2. This first up/down counter 2 outputs a count value S4 added by 1 when the signal S3 inputted from the phase comparator circuit 1 is an up signal, and outputs a count value S4 subtracted by 1 when the signal S3 is a down signal. In response to these operations, this count value S4 outputted from the first up/down counter 2 is inputted into the weighting circuit 3 and applied with weighting and switching, etc. This weighting circuit 3 generates and outputs an up signal or a down signal based on the count value S4 inputted from the first up/down counter 2. The up signal or down signal S5 outputted from this weighting circuit 3 is inputted into the voltage value determining part 4 and 5. This voltage value determining part 4 and 5 determines a voltage value based on the up signal or down signal S5 outputted from this weighting circuit 3, and outputs it as control voltage information S7 to the voltage controlled oscillator circuit 6. The voltage controlled oscillator circuit 6 is inputted with this control voltage information S7, and outputs a clock S8 which is generated so as to have an oscillation frequency determined based on this control voltage information S7. This clock S8 outputted from the voltage controlled oscillator circuit 6 is the extracted input clock, and becomes a clock to be outputted from this clock data recovery circuit. Therefore, by adjusting the phase of the extracted input clock outputted from this clock extracting part at the weighting circuit 3, jitter transfer characteristics of the output clock of this clock data recovery circuit can be improved.

Furthermore, in the first embodiment of the invention, the second up/down counter 7 is inputted with an up signal or down signal S3 outputted from the first phase comparator circuit 1, and then outputs a count value added by 1 when the up signal is inputted, and outputs a count value S9 subtracted by 1 when the down signal is inputted. The phase switching circuit 8 is inputted with the count value S9 from the second up/down counter 7 and the extracted input clock S8 outputted from the clock extracting part. Due to the count value S9 inputted from the second up/down counter 7, the phase switching circuit 8 can generate and output, as a retiming clock, a clock S2 the phase of which deviates from that of the extracted input clock S8.

The first counter 9 is inputted with the retiming clock S2 outputted from the retiming clock generating part, and outputs a count value S12 counted at the timings of this clock S2 and highest-order bit information S14 of this count value. The second counter 10 receives the extracted input clock S8 outputted from the clock extracting part, and outputs a count value S13 counted at the timings of this clock S8 and highest-order bit information S15 of this count value. The second phase comparator circuit 11 is inputted with the highest-order bit information S14 of the count value S12 outputted from the first counter 9 and the highest-order bit information S15 of the count value S13 outputted from the second counter 10. The second phase comparator circuit 11 compares the phases of these highest-order bit information S14 and S15, and based on a result of this comparison, outputs an up signal or down signal S16. The signal S16 outputted from this second phase comparator circuit 11 is inputted into the third up/down counter 12. This third up/down counter 12 outputs a count value S5 added by 1 when the signal S16 inputted from the second phase comparator circuit 11 is an up signal, and outputs a count value S5 subtracted by 1 when a down signal is inputted. This count value S5 outputted from the third up/down counter 12 is inputted into the weighting circuit 3 that is a component of the clock extracting part. The weighting circuit 3 outputs the count value S5 inputted from the third up/down counter 12 as an up signal or down signal S6 after applying weighting and switching, etc., to the count value S5. This signal outputted from the weighting circuit 3 is inputted into the voltage value determining part 4 and 5, and used for determining the oscillation frequency of the extracted input clock S8 to be generated by the voltage controlled oscillator circuit 6. Thus, the output S5 from the phase adjusting part is inputted into the clock extracting part and this clock extracting part changes the oscillation frequency of the clock S8 to be generated by this clock extracting part, whereby the clock can be outputted as an extracted input clock S8 which prevents the address value of the writing side of the first-in first-out memory part 13 from coinciding with the address value of the reading-out side.

Furthermore, the first phase comparator circuit 1 outputs a signal S10 obtained by retiming the serial data S1 as an input signal by the retiming clock S2 inputted from the retiming clock generating part. Then, the first-in first-out memory part 13 writes this signal S10 outputted from the first phase comparator circuit 1 to a location indicated by an address value that is equal to the count value S12 inputted from the first counter 9 at the timings of the retiming clock S2 inputted from the retiming clock generating part, and outputs a signal S11 readout from a location indicated by an address value that is equal to the count value S13 inputted from the second counter 10 at the timings of the extracted input clock S8 inputted from the clock extracting part. The signal S11 to be thus outputted is obtained by transferring the input signal S10 to the input clock that has been adjusted and extracted so as to improve the jitter transfer characteristics, so that this signal can be outputted as a signal in which jitter components have been suppressed.

Figure 10:
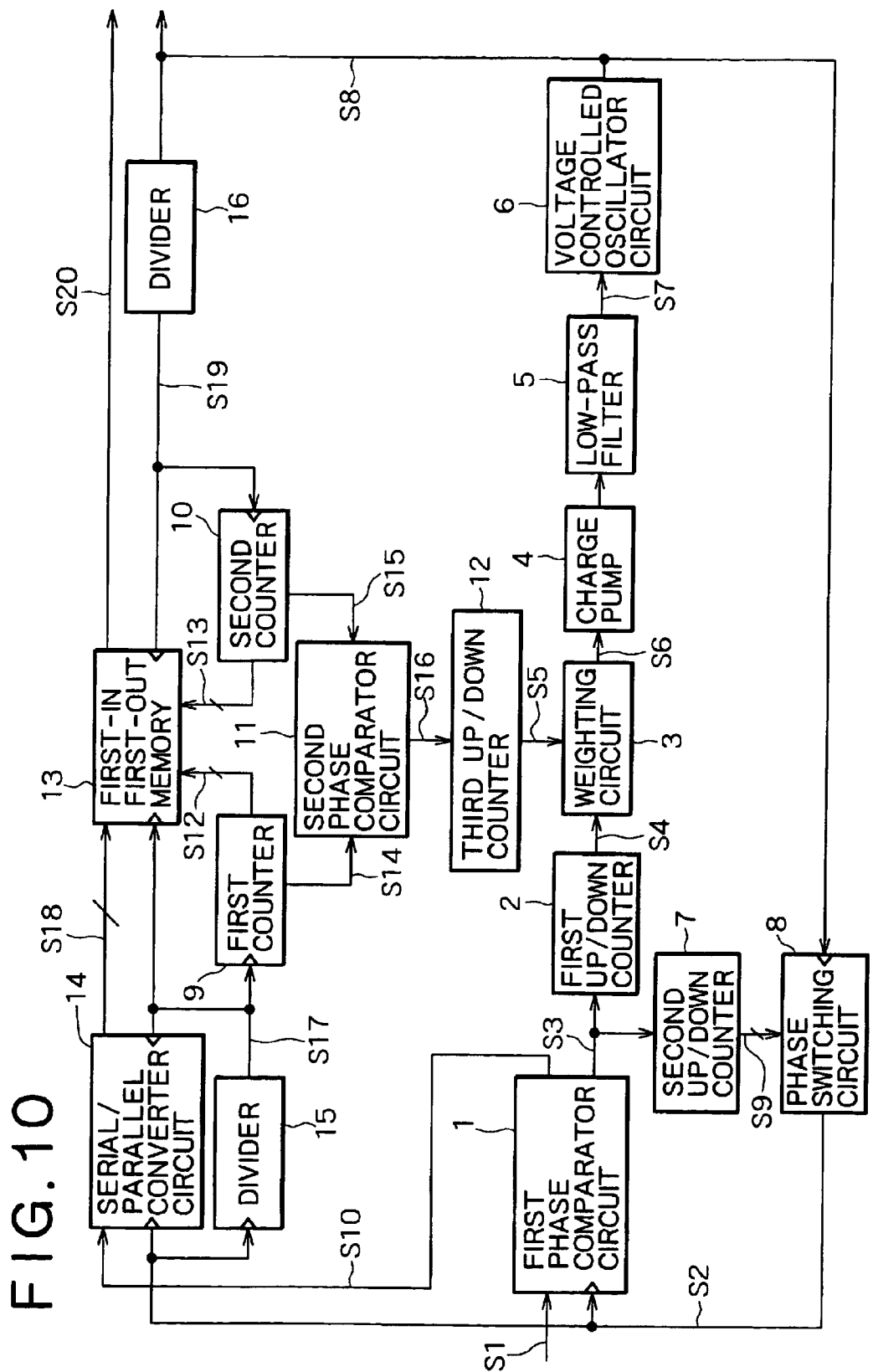
FIG. 10 is a block diagram showing the construction of a clock data recovery circuit relating to a second embodiment of the invention.

FIG. 10 is a block diagram showing the construction of a clock data recovery circuit relating to the second embodiment of the invention. In this clock data recovery circuit, as shown in FIG. 10, a serial/parallel converter circuit 14 is provided between the first phase comparator circuit 1 and the first-in first-out memory part 13. This serial/parallel converter circuit 14 converts the serial data S10 outputted from the first phase comparator circuit 1 into parallel data by inputting the serial data at the timings of the retiming clock S2, and then outputs it as parallel data S18 to the first-in first-out memory part 13 at the timings of the clock S17 inputted from a divider 15. The divider 15 divides clock S2 inputted from the phase switching circuit 8 and outputs it as a clock S17 toward the serial/parallel converter circuit 14, the first-in first-out memory part 13, and the first counter 9. Furthermore, as shown in FIG. 7, a divider 16 is also provided between the voltage controlled oscillator circuit 6 and the first-in first-out memory part 13. This divider 16 divides and outputs the clock S8 inputted from the voltage controlled oscillator circuit 6 toward the first-in first-out memory part 13 and the second counter 10.

By thus providing the serial/parallel converter circuit 14 at the input side of the first-in first-out memory part 13, even in a case of high-speed serial data that the conventional clock data recovery circuit has not be able to handle, an output signal and an extracted clock which satisfy the standards of both jitter transfer characteristics and jitter tolerance can be outputted.

As described in detail above, the clock data recovery circuit of the invention can generate a retiming clock for retiming an input signal independently from the clock extracting part. Therefore, even when the phase of an input clock extracted by the clock extracting part is adjusted so as to improve jitter transfer characteristics which results in lowering in jitter tolerance, a retiming clock satisfying the standards of jitter tolerance can be generated by separately adjusting the phase of the retiming clock at the retiming clock generating part. Furthermore, these retiming clock, extracted input clock, and input signal are input into the first-in first-out memory and applied with signal transfer, etc., whereby data that has been retimed by a retiming clock satisfying the standards of jitter tolerance and transferred to an extracted input clock satisfying the standards of jitter transfer characteristics can be outputted. Accordingly, it is possible to satisfy the standards of both jitter tolerance and jitter transfer characteristics.

What is claimed is:

1. A clock data recovery circuit to be used in the SONET/SDH, comprising:

a clock extracting part that receives an input signal and generates an extracted input clock and a retimed input signal;

a retiming clock generating part that receives the extracted input clock and generates a retiming clock received as an input by the clock extracting part for retiming said input signal;

a first-in first-out memory part that temporarily stores the retimed input signal using the retiming clock; and a phase adjusting part for preventing coincidence of a writing side address value and a reading-out side address value by controlling writing timings at the first-in first-out memory part by said retiming clock and controlling reading-out timings by said extracted input clock.

2. The clock data recovery circuit according to claim 1, wherein said clock extracting part comprises:

a first phase comparator circuit which outputs an up signal or down signal by comparing the phase of said retiming clock and the phase of said input signal, and outputs said retimed input signal after retiming it by the retiming clock;

a first up/down counter which outputs a count value added or subtracted by 1 in accordance with the up signal or down signal outputted from said first phase comparator circuit;

a weighting circuit which outputs a weighted up signal or down signal that has been weighted by the count value inputted from the first up/down counter;

a voltage value determining part which determines and outputs a voltage value based on the weighted up signal or down signal inputted from the weighted circuit; and a voltage controlled oscillator circuit which outputs said extracted input clock by determining the oscillation frequency in accordance with the voltage value inputted from the voltage value determining part.

3. The clock data recovery circuit according to claim 2, wherein said retiming clock generating part comprises:

a second up/down counter which outputs a count value added or subtracted by 1 in accordance with the up signal or down signal inputted from the first phase comparator circuit; and a phase switching circuit which outputs said retiming clock by adjusting the phase of said input clock inputted from the clock extracting part by the count value inputted from the second up/down counter.

4. The clock data recovery circuit according to claim 3, wherein said weighting circuit comprises:

a magnitude comparator for comparing the up signal or down signal inputted from the first up/down counter and a fixed value; and a logical circuit which determines a signal to be outputted to the voltage value determining part based on magnitude comparison data from said magnitude comparator, the count value from the first up/down counter, and a count value inputted from a third up/down counter.

5. The clock data recovery circuit according to claim 4, wherein said first phase comparator comprises:
   a first flip-flop which retimes said input signal by said retiming clock and then outputs the retimed input signal;
   a second flip-flop which outputs a high signal or low signal by comparing the phase of said input signal and the phase of said retiming clock; and
   a third flip-flop which outputs an up signal or down signal in accordance with the high signal or low signal inputted from said second flip-flop.

6. The clock data recovery circuit according to claim 3, wherein said phase adjusting part comprises:
   a first counter which outputs a count value counted at the timings of said retiming clock inputted from said retiming clock generating part and the highest-order bit of this count value;
   a second counter which outputs a count value counted at the timings of said extracted input clock inputted from said clock extracting part and the highest-order bit of this count value;
   a second phase comparator circuit which outputs an up signal or down signal by comparing the phase of the highest-order bit of the count value inputted from the first counter and the phase of the highest-order bit of the count value inputted from the second counter; and
   a third up/down counter which outputs a count value added or subtracted by 1 in accordance with the up signal or down signal inputted from said second phase comparator circuit.

7. The clock data recovery circuit according to claim 6, wherein said first phase comparator circuit comprises:
   a first flip-flop which retimes said input signal by said retiming clock and then outputs the retimed input signal;
   a second flip-flop which outputs a high signal or low signal by comparing the phase of said input signal and the phase of said retiming clock; and
   a third flip-flop outputs an up signal or down signal in accordance with the high signal or low signal inputted from said second flip-flop.

8. The clock data recovery circuit according to claim 3, wherein said first phase comparator circuit comprises:
   a first flip-flop which retimes said input signal by said retiming clock and then outputs the retimed input signal;
   a second flip-flop which outputs a high signal or low signal by comparing the phase of said input signal and the phase of said retiming clock; and
   a third flip-flop which outputs an up signal or down signal in accordance with the high signal or low signal inputted from said second flip-flop.

9. The clock data recovery circuit according to claim 2, wherein said weighting circuit comprises:
   a magnitude comparator for comparing the up signal or down signal inputted from the first up/down counter and a fixed value; and
   a logical circuit which determines a signal to be outputted to the voltage value determining part based on magnitude comparison data from said magnitude comparator, the count value from the first up/down counter, and a count value inputted from a third up/down counter.

10. The clock data recovery circuit according to claim 9, wherein said first phase comparator circuit comprises:
    a first flip-flop which retimes said input signal by said retiming clock and then outputs the retimed input signal;
    a second flip-flop which outputs a high signal or low signal by comparing the phase of said input signal and the phase of said retiming clock; and
    a third flip-flop which outputs an up signal or down signal in accordance with the high signal or low signal inputted from said second flip-flop.

11. The clock data recovery circuit according to claim 2, wherein said phase adjusting part comprises:
    a first counter which outputs a count value counted at the timings of said retiming clock inputted from said retiming clock generating part and the highest-order bit of this count value;
    a second counter which outputs a count value counted at the timings of said extracted input clock inputted from said clock extracting part and the highest-order bit of this count value;
    a second phase comparator circuit which outputs an up signal or down signal by comparing the phase of the highest-order bit of the count value inputted from the first counter and the phase of the highest-order bit of the count value inputted from the second counter; and
    a third up/down counter which outputs a count value added or subtracted by 1 in accordance with the up signal or down signal inputted from said second phase comparator circuit.

12. The clock data recovery circuit according to claim 11, wherein said first phase comparator circuit comprises:
    a first flip-flop which retimes said input signal by said retiming clock and then outputs the retimed input signal;
    a second flip-flop which outputs a high signal or low signal by comparing the phase of said input signal and the phase of said retiming clock; and
    a third flip-flop which outputs an up signal or down signal in accordance with the high signal or low signal inputted from said second flip-flop.

13. The clock data recovery circuit according to claim 2, wherein said first phase comparator circuit comprises:
    a first flip-flop which retimes said input signal by said retiming clock and then outputs the retimed input signal;
    a second flip-flop which outputs a high signal or low signal by comparing the phase of said input signal and the phase of said retiming clock; and
    a third flip-flop which outputs an up signal or down signal in accordance with the high signal or low signal inputted from said second flip-flop.

14. A clock data recovery circuit to be used in the SONET/SDH, comprising:
    a clock extracting part that receives an input signal and generates an extracted input clock and a retimed input signal;
    a retiming clock generating part that receives the extracted input clock and generates a retiming clock received as an input by the clock extracting part for retiming said input signal;

a first-in first-out memory part that temporarily stores the retimed input signal using the retiming clock; and a phase adjusting part for preventing coincidence of a writing side address value and a reading-out side address value by controlling writing timings at the first-in first-out memory part by said retiming clock and controlling reading-out timings by said extracted input clock;

wherein said clock extracting part comprises:

a first phase comparator circuit which outputs an up signal or down signal by comparing the phase of said retiming clock and the phase of said input signal, and outputs said retimed input signal based on the input signal and the retiming clock; and means for converting the up or down signal from the first phase comparator circuit into the extracted input clock.

15. The clock data recovery circuit of claim 14, wherein the means for converting the up or down signal comprises a first up/down counter which outputs a count value added or subtracted by 1 in accordance with the up signal or down signal outputted from said first phase comparator circuit.

16. The clock data recovery circuit of claim 15, wherein the means for converting the up or down signal further comprises a weighting circuit which outputs a weighting up signal or down signal that has been weighted by the count value inputted from the first up/down counter.

17. The clock data recovery circuit of claim 16, wherein the means for converting the up or down signal further comprises a voltage value determining part which determines and outputs a voltage value based on the weighted up signal or down signal inputted from the weighting circuit.

* * * * *